(12) United States Patent
Park et al.

(10) Patent No.: US 9,887,386 B2
(45) Date of Patent: Feb. 6, 2018

(54) DISPLAY DEVICE HAVING COMPENSATION LAYER

(71) Applicant: SAMSUNG DISPLAY CO., LTD., Yongin-si, Gyeonggi-do (KR)

(72) Inventors: Bo Ik Park, Uiwang-si (KR); Ju Chan Park, Seoul (KR); Pil Suk Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 68 days.

(21) Appl. No.: 14/852,195

(22) Filed: Sep. 11, 2015

(65) Prior Publication Data

US 2016/0226024 A1 Aug. 4, 2016

(30) Foreign Application Priority Data

Feb. 2, 2015 (KR) .......................... 10-2015-0016355

(51) Int. Cl.

| H01L 51/52 | (2006.01) |
| G02F 1/1333 | (2006.01) |
| H01L 27/32 | (2006.01) |
| H01L 51/00 | (2006.01) |
| H01L 27/12 | (2006.01) |

(52) U.S. Cl.
CPC .... *H01L 51/5256* (2013.01); *G02F 1/133305* (2013.01); *H01L 27/3262* (2013.01); *H01L 51/0097* (2013.01); *H01L 51/5253* (2013.01); *H01L 27/1218* (2013.01); *H01L 27/3244* (2013.01); *H01L 2251/301* (2013.01); *H01L 2251/303* (2013.01); *H01L 2251/5338* (2013.01); *H01L 2251/558* (2013.01); *Y02E 10/549* (2013.01)

(58) Field of Classification Search
CPC ......... H01L 2651/5338; H01L 51/0097; H01L 51/5256

See application file for complete search history.

(56) References Cited

U.S. PATENT DOCUMENTS

| 2011/0094288 A1* | 4/2011 | Medan .................... A61B 8/587 73/1.82 |
| 2014/0217397 A1* | 8/2014 | Kwak ................. H01L 27/1218 257/43 |
| 2014/0346474 A1* | 11/2014 | Jeong ...................... H01L 27/32 257/40 |

(Continued)

FOREIGN PATENT DOCUMENTS

| KR | 10-2008-0073942 A | 8/2008 |
| KR | 10-0956238 B1 | 5/2010 |

(Continued)

OTHER PUBLICATIONS

EPO Search Report dated Jun. 20, 2016, for corresponding European Patent application 16153683.4, (7 pages).

*Primary Examiner* — Lex Malsawma
*Assistant Examiner* — Xia Cross
(74) *Attorney, Agent, or Firm* — Lewis Roca Rothgerber Christie LLP

(57) ABSTRACT

A display device includes: a flexible substrate; a display unit on the flexible substrate and configured to display an image; and a compensation layer between the flexible substrate and the display unit.

30 Claims, 7 Drawing Sheets

(56) References Cited

U.S. PATENT DOCUMENTS

2014/0361262 A1* 12/2014 Kim .................... H01L 27/3218
                                                          257/40
2014/0367644 A1  12/2014 Song et al.
2015/0021562 A1*  1/2015 Kim .................... H01L 51/5253
                                                          257/40
2016/0346556 A1* 12/2016 Slepian ................ A61N 1/3785

FOREIGN PATENT DOCUMENTS

| KR | 10-2011-0106539 A | 9/2011 |
| KR | 10-2014-0060776 A | 5/2014 |
| KR | 10-2014-0061779 A | 5/2014 |

\* cited by examiner

DISPLAY DEVICE HAVING COMPENSATION LAYER

CROSS-REFERENCE TO RELATED APPLICATION

This application claims priority to and the benefit of Korean Patent Application No. 10-2015-0016355, filed in the Korean Intellectual Property Office on Feb. 2, 2015, the entire content of which is incorporated herein by reference.

BACKGROUND

1. Field

Aspects of embodiments of the present invention relate to a display device.

2. Description of the Related Art

A display device is a device configured to display an image, and recently, an organic light emitting diode display has received attention.

Because organic light emitting diode displays have a self-emission characteristic and may not require a separate light source, unlike liquid crystal displays, which may include a separate light source, organic light emitting diode displays may have a relatively lower thickness and weight. Further, organic light emitting diode displays have high-quality characteristics such as low power consumption, high luminance, and a high response speed.

In general, organic light emitting diode displays may includes a substrate, a thin film transistor positioned on the substrate, and an organic light emitting diode positioned on the thin film transistor and connected with the thin film transistor.

Recently, a flexible organic light emitting diode display in which a flexible substrate including a polymer material is included and at least a part of the flexible substrate is bent has been developed.

The above information disclosed in this Background section is only for enhancement of understanding of the background of the invention and therefore it may contain information that does not form the prior art that is already known in this country to a person of ordinary skill in the art.

SUMMARY

Aspects of embodiments of the present invention relate to a display device, and to a display device including a flexible substrate.

According to aspects of embodiments of the present invention, a display device may prevent or reduce instances of damage to thin film transistors corresponding to a bent part of the display device from being damaged by stress even though at least a part of a flexible substrate is bent.

According to example embodiments of the present invention, a display device includes: a flexible substrate; a display unit on the flexible substrate and configured to display an image; and a compensation layer between the flexible substrate and the display unit.

The compensation layer may include an alleviation layer having smaller Young's modulus than the flexible substrate.

A brittleness of the alleviation layer may be stronger than a brittleness of the flexible substrate.

The alleviation layer may include metal.

The alleviation layer may include metal oxide.

The compensation layer may further include a first passivation layer between the alleviation layer and the display unit.

A Young's modulus of the first passivation layer may be larger than a Young's modulus of the alleviation layer.

A thickness of the alleviation layer may be less than a thickness of the first passivation layer.

The first passivation layer may contact the alleviation layer.

The alleviation layer may contact the flexible substrate.

The alleviation layer may include a plurality of openings.

The first passivation layer may be in each of the plurality of openings.

The compensation layer may further include a second passivation layer between the alleviation layer and the flexible substrate.

A Young's modulus of the second passivation layer may be larger than a Young's modulus of the alleviation layer.

The second passivation layer may contact the alleviation layer.

The flexible substrate may include a bending area configured to be bent in a direction.

The flexible substrate may include a non-bending area adjacent to the bending area.

A first part of the alleviation layer corresponding to the non-bending area may be uncracked.

A second part of the alleviation layer corresponding to the bending area may include one or more cracks.

The cracks may be atypical cracks.

A part of the alleviation layer corresponding to the bending area may be thicker than a part of the alleviation layer outside the bending area.

The flexible substrate corresponding to the bending area may have a curvature radius, and a thickness of the alleviation layer may be inversely proportional to a size of the curvature radius.

The display unit may include an organic light emitting diode on the flexible substrate, and the display device may further include a driving unit between the compensation layer and the display unit and comprising a thin film transistor connected to the organic light emitting diode.

The thin film transistor may include an active layer on the flexible substrate, and compressive stress may be applied to the active layer corresponding to the bending area.

According to some example embodiments of the present invention, a display device includes: a flexible substrate; a display unit on the flexible substrate and configured to display an image; and a compensation layer between the flexible substrate and the display unit and having smaller Young's modulus than the flexible substrate.

According to some example embodiments of the present invention, a display device includes: a flexible substrate; a display unit on the flexible substrate and configured to display an image; and a compensation layer between the flexible substrate and the display unit and having stronger brittleness than the flexible substrate.

According to some example embodiments of the present invention, a display device includes: a flexible substrate comprising a bending area configured to be bent in a direction; a display unit on the flexible substrate and configured to display an image; and a compensation layer between the flexible substrate and the display unit, wherein a first part of the compensation layer corresponding to the bending area comprises one or more cracks.

The flexible substrate may further include a non-bending area contiguous with the bending area.

A second part of the compensation layer corresponding to the non-bending area may be uncracked.

The cracks may be atypical cracks.

A Young's modulus of the compensation layer may be smaller than a Young's modulus of the flexible substrate.

According to example embodiments of the present invention, a display device may prevent or reduce instances of a thin film transistor corresponding to a bent part from being damaged by stress even though at least a part of the flexible substrate is bent.

DETAILED DESCRIPTION

Figure 1:
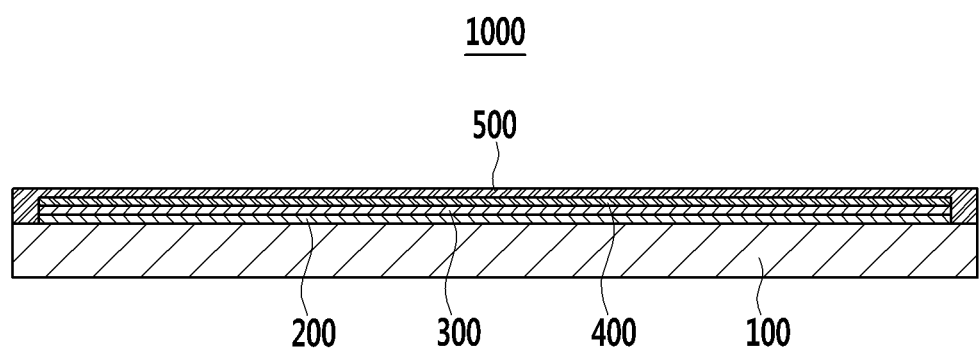
FIG. 1 is a cross-sectional view schematically illustrating a display device according to an example embodiment of the present invention.

Aspects of embodiments of the present invention will be described more fully hereinafter with reference to the accompanying drawings, in which example embodiments of the present invention are shown. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

Further, in example embodiments, because like reference numerals designate like elements having the same configuration, a first example embodiment is representatively described, and in other example embodiments, aspects that are different from the first example embodiment will be described in some detail, while some repetitive description may be omitted.

In addition, the size and thickness of each configuration shown in the drawings are shown for understanding and ease of description, but the present invention is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Further, throughout the specification, the word "on" means positioning on or below the object portion, but does not essentially mean positioning on the upper side of the object portion based on a gravity direction.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a display device according to an example embodiment of the present invention will be described with reference to FIGS. 1 to 4.

In another example embodiment of the present invention, as the flexible display panel FD, the organic light emitting diode display including the organic light emitting diode is described as an example, but the flexible display panel according to yet another example embodiment of the present invention may include various display devices such as liquid crystal displays (LCDs), plasma displays (PDs), field emission displays (FEDs), electrophoretic displays (EPDs), and electrowetting displays (EWDs), but the display panels may be flexible.

Figure 2:
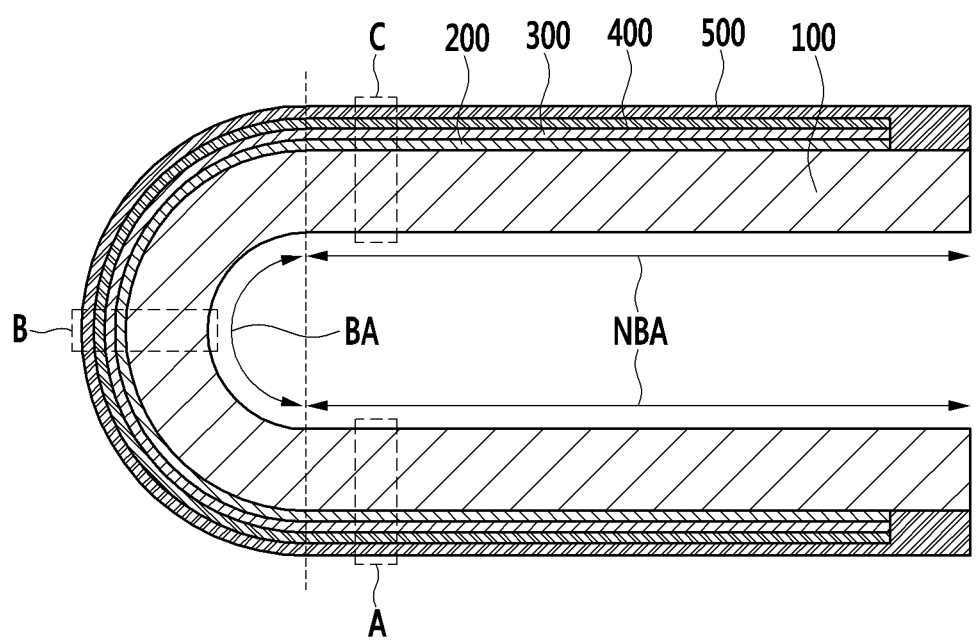
FIG. 2 is a cross-sectional view illustrating a view in which the display device illustrated in FIG. 1 is bent.

FIG. 1 is a cross-sectional view schematically illustrating a display device according to an example embodiment of the present invention. FIG. 2 is a cross-sectional view illustrating a view or configuration in which the display device illustrated in FIG. 1 is bent.

As illustrated in FIGS. 1 and 2, the display device according to the example embodiment of the present invention includes a flexible substrate 100, a compensation layer 200, a driving unit 300, a display unit 400, and an encapsulation part (or encapsulation layer or encapsulant) 500.

The flexible substrate 100 is flexible, but is not limited thereto and may be stretchable, foldable, bendable, or rollable. The flexible substrate 100 is flexible, stretchable, foldable, bendable, or rollable, and as a result, the entire flexible display panel FD may be flexible, stretchable, foldable, bendable, or rollable.

The flexible substrate 100 may be bent in one direction. Here, one direction may be any direction on a surface of the flexible substrate 100 and is not limited to a predetermined direction. As one example, the flexible substrate 100 may have a rectangular shape in a plane and in this case, one direction in which the rectangular flexible substrate 100 is bent may be a direction parallel to a long side or a short side of the flexible substrate 100. That is, the flexible substrate 100 may be bent in a short side direction or a long side direction in plane.

The flexible substrate 100 may include at least one of a polymer material such as polyimide, and the like, a metallic material, and an inorganic material and is not limited thereto and may include any material, which may be bent. The flexible substrate 100 may have a film form.

The flexible substrate 100 includes a bending area BA bent in one direction and a non-bending area NBA contiguous with the bending area BA. The bending area BA may be positioned at the center of the flexible substrate 100, and the non-bending area NBA may be positioned outside the flexible substrate 100. The bending area BA of the flexible substrate 100 is contiguous with the non-bending area NBA. In FIG. 2, the bending area BA of the flexible substrate 100 has a curvature radius in a right direction, but is not limited thereto and the bending area BA of the flexible substrate 100 may have the curvature radius in a left direction or any other direction according to the orientation of the flexible substrate 100.

Each of the compensation layer 200, the driving unit 300, the display unit 400, and the encapsulation part 500 positioned on the bending area BA of the flexible substrate 100 is bent in one direction to correspond to the bending of the flexible substrate 100.

Meanwhile, in the example embodiment of the present invention, the flexible substrate 100 includes the bending area BA and the non-bending area NBA, but the present invention is not limited thereto and in another example embodiment of the present invention, the entirety of the flexible substrate 100 may be formed by the bending area BA.

Further, in the example embodiment of the present invention, the bending area BA of the flexible substrate 100 is positioned at the center of the flexible substrate 100, but the present invention is not limited thereto and in another example embodiment of the present invention, the bending area BA of the flexible substrate 100 may be positioned outside the flexible substrate 100.

Figure 3:
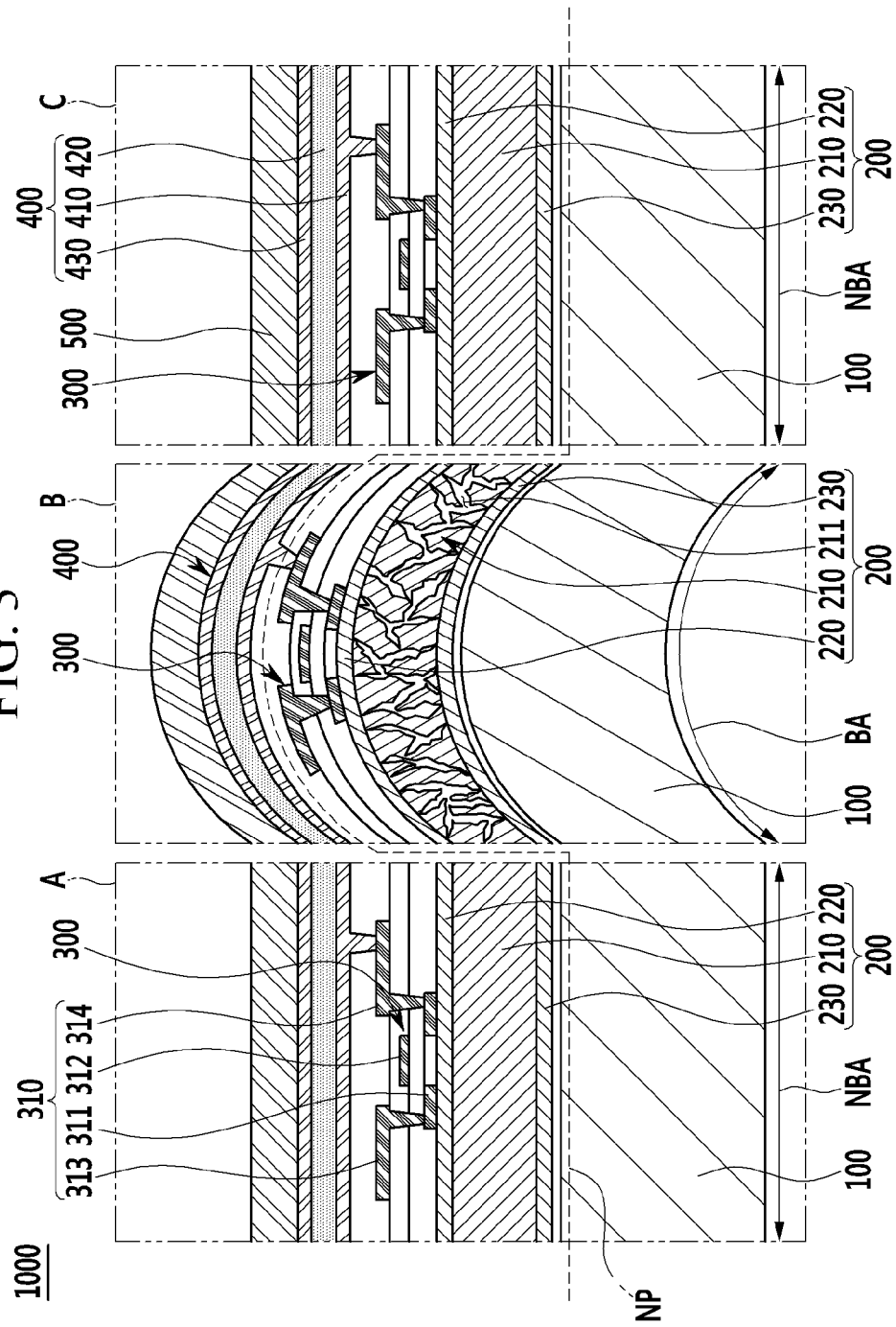
FIG. 3 is a cross-sectional view illustrating each of part A, part B, and part C of the display device illustrated in FIG. 2.
Figure 4:
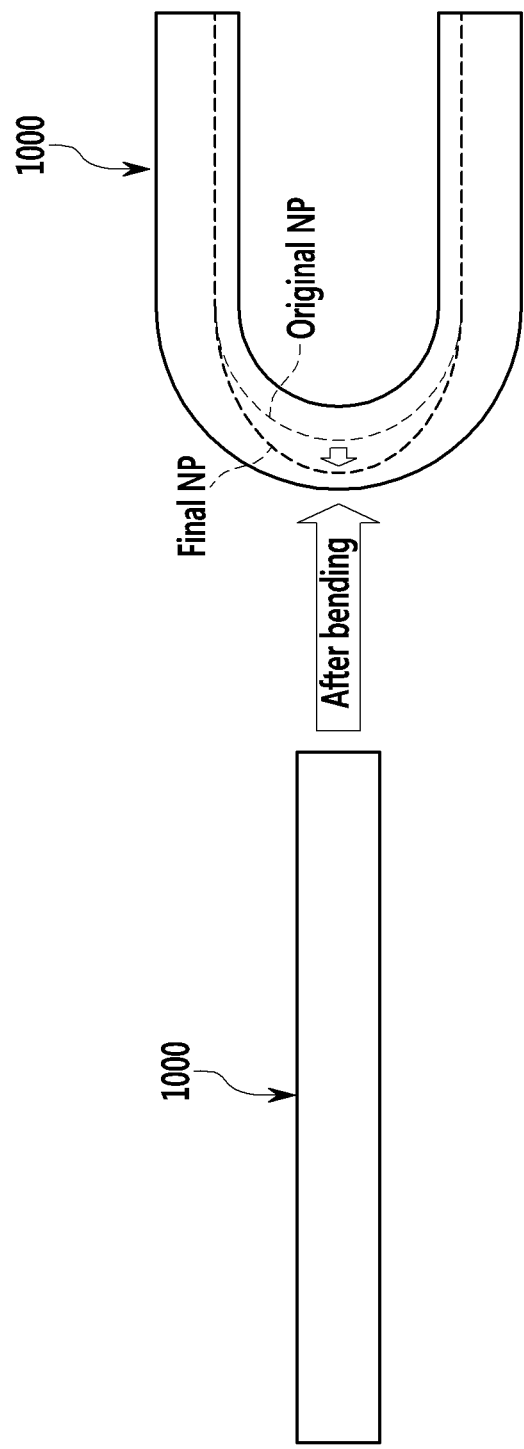
FIGS. 4A-4B is a cross-sectional view schematically illustrating a neutral plane where the display device according to example embodiments of the present invention is bent.

FIG. 3 is a cross-sectional view illustrating part A, part B, and part C of the display device illustrated in FIG. 2. Part A and part C of FIGS. 3 and 2 correspond to the non-bending area NBA of the flexible substrate 100 and part B corresponds to the bending area BA of the flexible substrate 100.

As illustrated in FIGS. 1 to 3, the compensation layer 200 is positioned between the flexible substrate 100 and the display unit 400 and, for example, the compensation layer 200 is positioned between the flexible substrate 100 and the driving unit 300.

The compensation layer 200 has a smaller Young's modulus than the flexible substrate 100 and stronger brittleness (e.g., may be less brittle) than the flexible substrate 100. That is, the compensation layer 200 is more brittle than the flexible substrate 100, and as a result, a part of the compensation layer 200 corresponding to the bending area BA of the flexible substrate 100 includes one or more cracks 211. The cracks 211 of the compensation layer 200 may occur due to the bending of the flexible substrate 100 and may be atypical cracks. That is, the cracks 211 may have a shape or pattern that is arbitrary. Contrary to this, the other parts of the compensation layer 200 corresponding to the non-bending area NBA of the flexible substrate 100 may be uncracked (e.g., may have a uniform structure without cracks or gaps in the material). The cracks 211 formed on the compensation layer 200 may be formed by air gaps.

According to some embodiments of the present invention, the compensation layer 200 includes an alleviation layer 210, a first passivation layer 220, and a second passivation layer 230.

The alleviation layer 210 is positioned between the first passivation layer 220 and the second passivation layer 230. The alleviation layer 210 alleviates the stress caused due to the bending of the flexible substrate 100 and shifts the position of a neutral plane (NP) formed in the display device 1000. The alleviation layer 210 has a smaller Young's modulus than the flexible substrate 100 and stronger brittleness (e.g., less brittle) than the flexible substrate 100. That is, the alleviation layer 210 is more brittle than the flexible substrate 100, and as a result, a part of the alleviation layer 210 corresponding to the bending area BA of the flexible substrate 100 includes one or more cracks 211. The cracks 211 of the alleviation layer 210 may occur due to the bending of the flexible substrate 100 and may be the atypical (e.g., non-uniform or arbitrarily shaped) cracks. Additionally, the other part of the alleviation layer 210 corresponding to the non-bending area NBA of the flexible substrate 100 may be uncracked.

The alleviation layer 210 contacts each of the first passivation layer 220 and the second passivation layer 230, and the first passivation layer 220 and the second passivation layer 230 prevent fragments of the alleviation layer 210 in which the cracks 211 occur from unintentionally moving toward the flexible substrate 100 or the driving unit 300.

The alleviation layer 210 includes brittle metal or metal oxide. As one example, the alleviation layer 210 may include brittle metal or metal oxide such as MoOx, Mo, Ti, and the like. The alleviation layer 210 may have a smaller Young's modulus and stronger brittleness (e.g., less brittle) than each of the first passivation layer 220 and the second passivation layer 230 and the first passivation layer 220 and the second passivation layer 230 may have larger Young's modulus than the alleviation layer 210. As a result, a part of the alleviation layer 210 corresponding to the bending area BA of the flexible substrate 100 may include one or more cracks 211 and even though the cracks 211 occur at a part of the alleviation layer 210, no crack may occur in each of the first passivation layer 220 and the second passivation layer 230. The alleviation layer 210 may have a smaller thickness than each of the first passivation layer 220 and the second passivation layer 230.

Meanwhile, in the example embodiment of the present invention, the alleviation layer 210 includes the brittle metal or metal oxide, but the present invention is not limited thereto and the alleviation layer 210 may include an inorganic material such as brittle glass, brittle ceramics, and the like or brittle silicon (Si), and the like and the alleviation layer 210 may include any material which is brittle.

The first passivation layer 220 is positioned between the alleviation layer 210 between the alleviation layer 210 and the display unit 400, and the driving unit 300 and the second passivation layer 230 is positioned between the alleviation layer 210 and the flexible substrate 100.

The first passivation layer 220 and the second passivation layer 230 are separated from each other with the alleviation layer 210 interposed therebetween and contact the alleviation layer 210. Each of the first passivation layer 220 and the second passivation layer 230 may have larger Young's modulus than the alleviation layer 210. Each of the first passivation layer 220 and the second passivation layer 230 may include a high elastic polymer material such as PSA and PDMS or a high flexible metallic material such as Al and Au, but is not limited thereto and may include various polymer materials or various metallic materials. Each of the first passivation layer 220 and the second passivation layer 230 prevents the fragments of the alleviation layer 210 by the cracks 211 in the alleviation layer 210 from moving to the driving unit 300 and the flexible substrate 100.

The driving unit 300 and the display unit 400 are positioned on the compensation layer 200.

The driving unit 300 is positioned on the flexible substrate 100 with the compensation layer 200 interposed therebetween and includes one or more thin film transistors 310 connected with the display unit 400.

Meanwhile, in the example embodiment of the present invention, for convenience of description, the driving unit 300 includes the thin film transistor 310, but the present invention is not limited thereto, and the driving unit 300 may further include one or more scan wires, one or more data wires, a plurality of thin film transistors, and one or more capacitors, and these components may have various known structures.

The thin film transistor 310 includes an active layer 311, a gate electrode 312, a source electrode 313, and a drain electrode 314.

The active layer 311 is positioned on the compensation layer 200 and may be made of polysilicon or an oxide semiconductor. The oxide semiconductor may include any one of oxides based on titanium (Ti), hafnium (Hf), zirconium (Zr), aluminum (Al), tantalum (Ta), germanium (Ge), zinc (Zn), gallium (Ga), tin (Sn), or indium (In), and zinc oxide (ZnO), indium-gallium-zinc oxide (InGaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O) which are complex oxides thereof.

The active layer 311 includes a channel region in which impurities are not doped, and a source region and a drain region formed when impurities are doped to two sides of the channel region. Herein, the impurities may vary according to the kind of the thin film transistor, and may be N-type impurities or P-type impurities. In the case where the active layer 311 is formed of the oxide semiconductor, in order to protect the oxide semiconductor, which is vulnerable to an external environment such as exposure to a high temperature, a separate passivation layer may be added.

Compressive stress by the compensation layer 200 is applied to the active layer 311 corresponding to the bending area BA of the flexible substrate 100 in the active layer 311. In detail, in the display device 1000, the neutral plane NP is formed between the compensation layer 200 and the flexible substrate 100 which is a center portion of a total thickness to correspond to the total thickness formed by each of the flexible substrate 100, the compensation layer 200, the driving unit 300, the display unit 400, and the encapsulation part 500, but the neutral plane NP is formed between the driving unit 300 and the display unit 400 by the compensation layer 200 at a part of the display device 1000 corresponding to the bending area BA of the flexible substrate 100, and as a result, the alleviated compressive stress is applied to the active layer 311.

As one example, when a bending moment occurs at a part of the display device 1000 corresponding to the bending area BA of the flexible substrate 100, the alleviation layer 210 of the compensation layer 200 corresponding to the bending area BA is transformed due to the cracks 211 according to the stress applied to the display device 1000, and as a result, the stress applied to a part of the display device 1000 corresponding to the bending area BA of the flexible substrate 100 is alleviated and the neutral plane NP moves between the driving unit 300 and the display unit 400 to correspond to a thickness formed by the driving unit 300 and the display unit 400. Therefore, the alleviated compressive stress is applied to the active layer 311.

That is, when the bending moment occurs at a part of the display device 1000 corresponding to the bending area BA of the flexible substrate 100, the cracks 211 occur in the compensation layer 200 which has a smaller Young's modulus and stronger brittleness (e.g., less brittle), which corresponds to the bending area BA of the flexible substrate 100 due to the stress, and as a result, the stress applied to a part of the display device 1000 corresponding to the bending area BA is alleviated and the neutral plane NP moves between the driving unit 300 and the display unit 400 to correspond to the bending area BA with the transformation of the compensation layer 200. Therefore, not tensile stress but the alleviated compressive stress is applied to the active layer 311 to prevent or reduce instances of the active layer 311 being broken.

The gate electrode 312 is positioned on the active layer 311, and each of the source electrode 313 and the drain electrode 314 are positioned on an upper side of the gate electrode 312, and as a result, each of the source electrode 313 and the drain electrode 314 is connected with a source region and a drain region of the active layer 311 through a contact hole.

In order to prevent or reduce instances of a short-circuit between the active layer 311, the gate electrode 312, the source electrode 313, and the drain electrode 314, which are components of the thin film transistor 310, one or more insulating layers are positioned among the components of the thin film transistor 310. The insulating layer includes an inorganic material such as silicon nitride or silicon oxide, and for example, the insulating layer may include one or more of SiNx, $Al_2O_3$, $SiO_2$, and $TiO_2$.

The drain electrode 314 of the thin film transistor 310 is connected with the organic light emitting diode of the display unit 400.

The display unit 400 may be positioned on the flexible substrate 100 with the compensation layer 200 and the driving unit 300 interposed therebetween and display an image by using a plurality of pixels. Here, the pixel may refer to a minimum unit configured to displaying the image.

The display unit 400 includes an organic light emitting diode that emits light.

The organic light emitting diode includes a first electrode 410 connected with the drain electrode 314 of the thin film transistor 310, an organic emission layer 420 positioned on the first electrode 410, and a second electrode 430 positioned on the organic emission layer 420. That is, the first electrode 410, the organic light emitting layer 420, and the second electrode 430 of the display unit 400 form the organic light emitting diode.

The first electrode 410 may be an anode, which is a hole injection electrode, and may be any one electrode of light-reflective, light-transflective, and light-transmissive electrodes. Meanwhile, in another example embodiment of the present invention, the first electrode 410 may be a cathode, which is an electron injection electrode.

The organic emission layer 420 is positioned on the first electrode 410. The organic emission layer 420 may be made of a low-molecular organic material or a high-molecular organic material such as poly 3,4-ethylenedioxythiophene (PEDOT). The organic emission layer 420 may include a red organic emission layer for emitting red light, a green organic emission layer for emitting green light, and a blue organic emission layer for emitting blue light. The red organic emission layer, the green organic emission layer, and the blue organic emission layer are formed in a red pixel, a green pixel, and a blue pixel, respectively, thereby implementing a colored image. In the organic emission layer 420, all of the red organic emission layer, the green organic emission layer, and the blue organic emission layer are together laminated on the red pixel, the green pixel, and the blue pixel, and a red color filter, a green color filter, and a blue color filter are formed for each pixel, thereby implementing a color image. As another example, white organic emission layers emitting white light are formed in all of the red pixel, the green pixel, and the blue pixel, and a red color filter, a green color filter, and a blue color filter are formed for each pixel, thereby implementing the color image. In the case of implementing the color image by using the white organic emission layer as the organic emission layer 420 and the color filters, a deposition mask may not be utilized for depositing the red organic emission layer, the green organic emission layer, and the blue organic emission layer on respective pixels, that is, the red pixel, the green pixel, and the blue pixel. The white organic emission layer as the organic emission layer 420 described in another example may be formed by one organic emission layer, and also includes a configuration formed so as to emit white light by laminating a plurality of organic emission layers. For example, the organic emission layer 420 may include a configuration that may emit white light by combining at least one yellow organic emission layer and at least one blue light emitting layer, a component that may emit white light by combining at least one cyan organic emission layer and at least one red light emitting layer, a component that may emit white light by combining at least one magenta organic emission layer and at least one green light emitting layer, and the like.

The second electrode 430 is positioned on the organic emission layer 420 and may be a cathode that is an electron injection electrode. The second electrode 430 may be one electrode of light-reflective, light-transflective, and light-transmissive electrodes. The second electrode 430 is positioned over (e.g., to extend across) the flexible substrate 100 so as to cover the organic emission layer 420. Meanwhile, in another example embodiment of the present invention, the second electrode 430 may be an anode that is a hole injection electrode.

The encapsulation part 500 is positioned on the display unit 400.

The encapsulation part 500 is positioned on the flexible substrate 100 with the compensation layer 200, the driving unit 300, and the display unit 300 interposed therebetween. The encapsulation part 500 is positioned on the flexible substrate 100 over (e.g., to extend across) the flexible substrate 100 and encapsulates the driving unit 300 and the display unit 400 together with the flexible substrate 100. The encapsulation part 500 may be formed by a thin film encapsulation unit. The encapsulation part 500 may include an organic layer and an inorganic layer positioned on the organic layer. As one example, the encapsulation part 500 may include one or more organic layers and one or more inorganic layers that are alternately laminated, and in detail, the inorganic layers or the organic layers may be in plural, respectively, and the plurality of inorganic layers and the plurality of organic layers may be alternately laminated. The encapsulation part 500 may include at least one sandwich structure in which at least one organic layer is inserted between at least two inorganic layers. The inorganic layer positioned on the top layer of the encapsulation part 500 may be laminated with a larger area than the organic layer so as to cover an end of the organic layer that is another layer. The organic layer of the encapsulation part 500 is made of polymer, and according to some embodiments, may be a single layer or a laminated layer formed of any one of polyethylene terephthalate, polyimide, polycarbonate, epoxy, polyethylene, and polyacrylate. For example, the organic layer may be formed of polyacrylate and, for example, includes a material in which a monomer composition including diacrylate-based monomers and triacrylate-based monomers is polymerized. Herein, the monomer composition may further include monoacrylate-based monomers, and further include a known photo-initiator such as TOP, but is not limited thereto. The inorganic layer of the encapsulation part 500 may be a single layer or a laminated layer including metal oxide or metal nitride. In detail, the inorganic layer may include one or more of SiNx, $Al_2O_3$, $SiO_2$, and $TiO_2$. A protection film may be positioned at each of an upper portion of the encapsulation part 500 and a lower portion of the flexible substrate 100. The protection film may serve to protect each of the encapsulation part 500 and the flexible substrate 100 from external interference.

As described above, in the example embodiment of the present invention, when the bending moment occurs at a part of the display device 1000 corresponding to the bending area BA of the flexible substrate 100, the cracks 211 occur in the compensation layer 200 which has a smaller Young's modulus and stronger brittleness (e.g., less brittle), which corresponds to the bending area BA of the flexible substrate 100 due to the stress, and as a result, the stress applied to a part of the display device 1000 corresponding to the bending area BA is alleviated and the neutral plane NP moves between the driving unit 300 and the display unit 400 to correspond to the bending area BA with the transformation of the compensation layer 200. Therefore, not the tensile stress but the alleviated compressive stress is applied to the active layer 311 to prevent the active layer 311 from being broken.

FIGS. 4A-4B is a cross-sectional view schematically illustrating a neutral plane where the display device according to the example embodiment of the present invention is bent. FIG. 4A is a cross-sectional view illustrating the display device before being bent and FIG. 4B is a cross-sectional view illustrating the display device after being bent.

In the display device according to the example embodiment of the present invention, as illustrated in FIG. 4A, in a flat state, when the bending moment occurs at a part of the display device 1000 as illustrated in FIG. 4B, the cracks occur in the compensation layer, and as a result, an original NP formed in the display device 1000 moves to a final NP to correspond to the bending area. Therefore, not the tensile stress but the alleviated compressive stress is applied to the thin film transistor of the driving unit to prevent the driving unit including the active layer from being broken due to the stress.

That is, a display device 1000 is provided in which even though a part equal to or larger than a part of the flexible substrate 100 is bent, the thin film transistor corresponding to the bent part is prevented from being broken due to the stress.

Hereinafter, a display device according to another example embodiment of the present invention will be described with reference to FIG. 5. Hereinafter, different parts from the display device according to the example embodiment of the present invention described above will be described.

Figure 5:
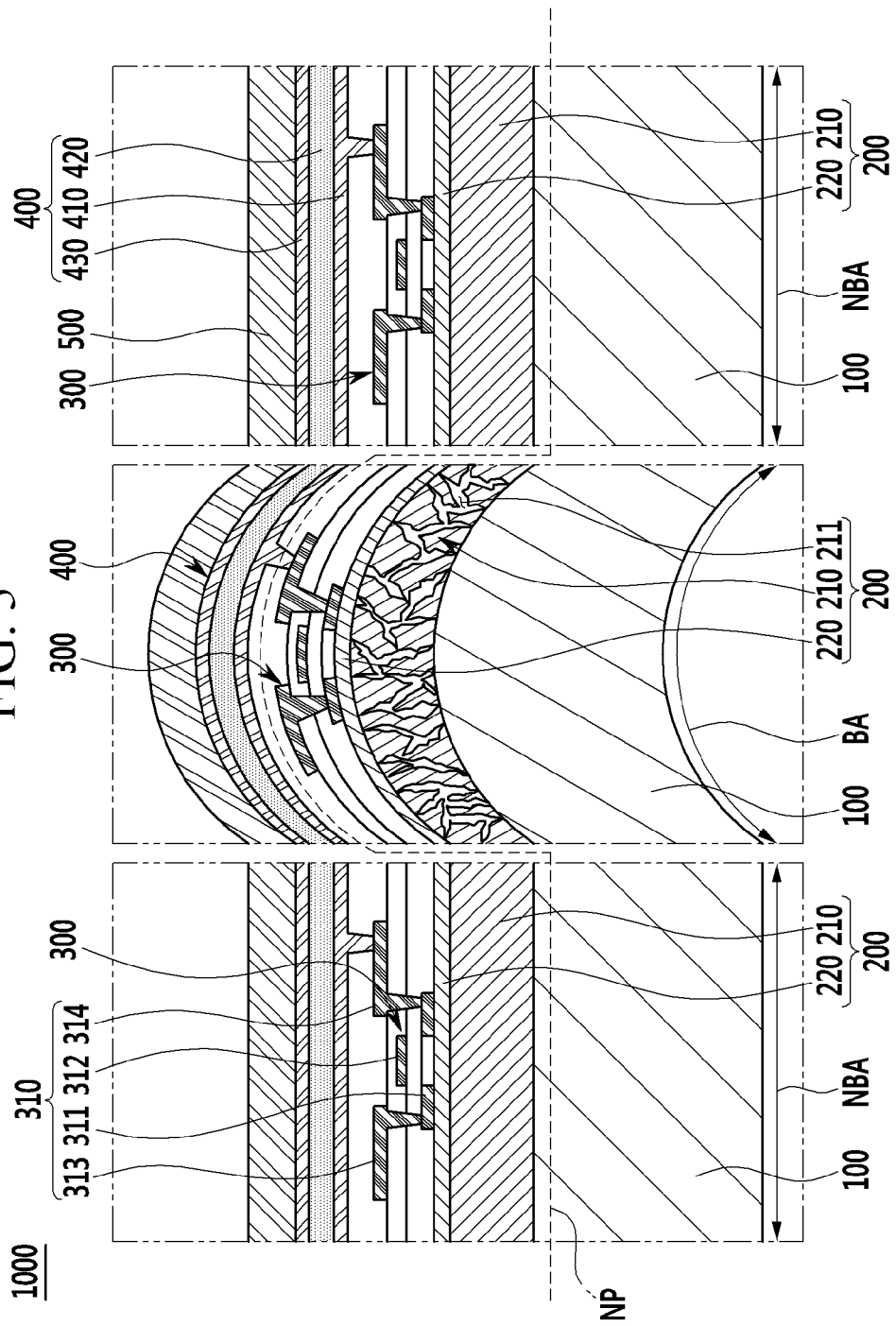
FIG. 5 is a cross-sectional view illustrating each of a bending area and a non-bending area of the display device according to example embodiments of the present invention.

FIG. 5 is a cross-sectional view illustrating each of a bending area and a non-bending area of the display device according to another example embodiment of the present invention.

As illustrated in FIG. 5, the compensation layer 200 of the display device 1000 according to another example embodiment of the present invention includes an alleviation layer 210 and the first passivation layer 220.

The alleviation layer 210 is positioned between the first passivation layer 220 and the flexible substrate 100. The alleviation layer 210 alleviates the stress caused due to the bending of the flexible substrate 100 and shifts the position of the neutral plane (NP) formed in the display device 1000. The alleviation layer 210 has a smaller Young's modulus than the flexible substrate 100 and stronger brittleness (e.g., less brittle) than the flexible substrate 100. That is, the alleviation layer 210 is more brittle than the flexible substrate 100, and as a result, a part of the alleviation layer 210 corresponding to the bending area BA of the flexible substrate 100 includes one or more cracks 211. The cracks 211 of the alleviation layer 210 may occur due to the bending of the flexible substrate 100 and may be the atypical cracks. Additionally, the other part of the alleviation layer 210 corresponding to the non-bending area NBA of the flexible substrate 100 is uncracked.

The alleviation layer 210 contacts each of the first passivation layer 220 and the flexible substrate 100, and the first passivation layer 220 and the flexible substrate 100 may prevent or reduce instances of fragments of the alleviation layer 210 in which the cracks 211 occur from unintentionally moving toward the driving unit 300.

The alleviation layer 210 includes brittle metal or metal oxide. As one example, the alleviation layer 210 may include brittle metal or metal oxide such as MoOx, Mo, Ti, and the like. The alleviation layer 210 may have a smaller Young's modulus and stronger brittleness (e.g., less brittle) than each of the first passivation layer 220 and the flexible substrate 100 and the first passivation layer 220 and the flexible substrate 100 may have larger Young's modulus than the alleviation layer 210. As a result, a part of the alleviation layer 210 corresponding to the bending area BA of the flexible substrate 100 may include one or more cracks 211 and even though the cracks 211 occur at a part of the alleviation layer 210, no crack occurs in each of the first passivation layer 220 and the flexible substrate 100. The alleviation layer 210 may have a smaller thickness than each of the first passivation layer 220 and the flexible substrate 100.

The passivation layer 220 is positioned between the alleviation layer 210 between the alleviation layer 210 and the display unit 400, and the driving unit 300.

The first passivation layer 220 and the flexible substrate 100 are separated from each other with the alleviation layer 210 interposed therebetween and contact the alleviation layer 210. The first passivation layer 220 may have larger Young's modulus than the alleviation layer 210. The first passivation layer 220 may include a high elastic polymer material such as PSA and PDMS or a high flexible metallic material such as Al and Au, but is not limited thereto and may include various polymer materials or various metallic materials. The first passivation layer 220 may prevent or reduce instances of the fragments of the alleviation layer 210 by the cracks 211 in the alleviation layer 210 from moving to the driving unit 300.

The compressive stress by the compensation layer 200 is applied to the active layer 311 corresponding to the bending area BA of the flexible substrate 100 in the active layer 311 of the thin film transistor 310 of the driving unit 300. For example, in the display device 1000, the neutral plane NP is formed between the compensation layer 200 and the flexible substrate 100 that is a center portion of a total thickness to correspond to the total thickness formed by each of the flexible substrate 100, the compensation layer 200, the driving unit 300, the display unit 400, and the encapsulation part 500, but the neutral plane NP is formed between the driving unit 300 and the display unit 400 by the compensation layer 200 at a part of the display device 1000 corresponding to the bending area BA of the flexible substrate 100, and as a result, the alleviated compressive stress is applied to the active layer 311.

As one example, when a bending moment occurs at a part of the display device 1000 corresponding to the bending area BA of the flexible substrate 100, the alleviation layer 210 of the compensation layer 200 corresponding to the bending area BA is transformed due to the cracks 211 according to the stress applied to the display device 1000, and as a result, the stress applied to a part of the display device 1000 corresponding to the bending area BA of the flexible substrate 100 is alleviated and the neutral plane NP moves between the driving unit 300 and the display unit 400 to correspond to a thickness formed by the driving unit 300 and the display unit 400. Therefore, the alleviated compressive stress is applied to the active layer 311.

That is, when the bending moment occurs at a part of the display device 1000 corresponding to the bending area BA of the flexible substrate 100, the cracks 211 occur in the compensation layer 200 which has a smaller Young's modulus and stronger brittleness (e.g., less brittle), which corresponds to the bending area BA of the flexible substrate 100 due to the stress, and as a result, the stress applied to a part of the display device 1000 corresponding to the bending area BA is alleviated and the neutral plane NP moves between the driving unit 300 and the display unit 400 to correspond to the bending area BA with the transformation of the compensation layer 200. Therefore, not tensile stress but the alleviated compressive stress is applied to the active layer 311 to prevent or reduce instances of the active layer 311 being broken.

As described above, in another example embodiment of the present invention, when the bending moment occurs at a part of the display device 1000 corresponding to the bending area BA of the flexible substrate 100, the cracks 211 occur in the compensation layer 200 which has a smaller Young's modulus and stronger brittleness (e.g., less brittle), which corresponds to the bending area BA of the flexible substrate 100 due to the stress, and as a result, the stress applied to a part of the display device 1000 corresponding to the bending area BA is alleviated and the neutral plane NP moves between the driving unit 300 and the display unit 400 to correspond to the bending area BA with the transformation of the compensation layer 200. Therefore, not the tensile stress but the alleviated compressive stress is applied to the active layer 311 to prevent or reduce instances of the active layer 311 being broken.

That is, a display device 1000 is provided in which even though a part equal to or larger than a part of the flexible substrate 100 is bent, instances of the thin film transistor 310 corresponding to the bent part may be prevented or reduced from being broken due to the stress.

Hereinafter, a display device according to another example embodiment of the present invention will be described with reference to FIG. 6. Hereinafter, different parts from the display device according to the example embodiment of the present invention described above will be described.

Figure 6:
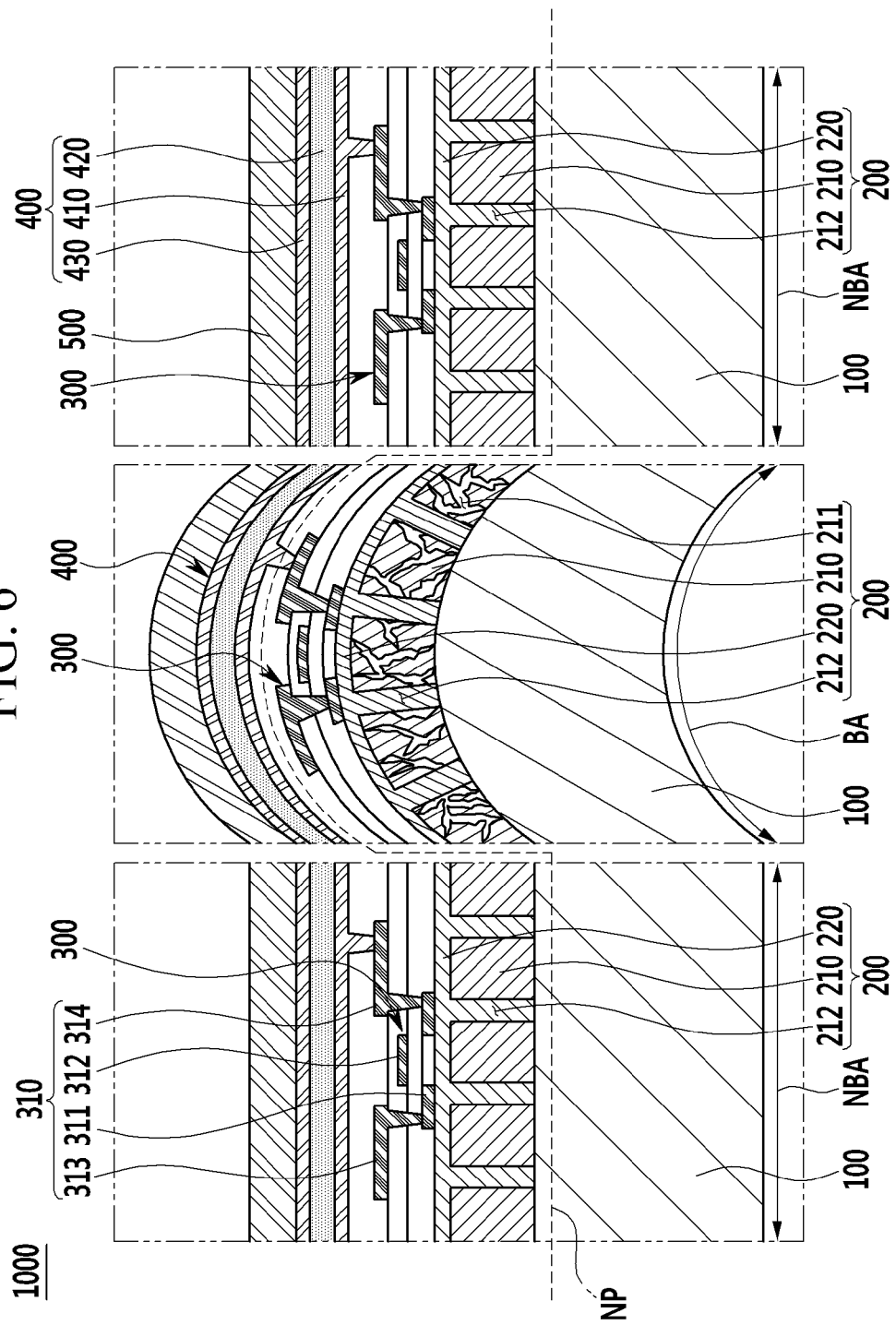
FIG. 6 is a cross-sectional view illustrating each of the bending area and the non-bending area of the display device according to example embodiments of the present invention.

FIG. 6 is a cross-sectional view illustrating each of the bending area and the non-bending area of the display device according to another example embodiment of the present invention.

As illustrated in FIG. 6, the compensation layer 200 of the display device 1000 according to another example embodiment of the present invention includes an alleviation layer 210 and the first passivation layer 220.

The alleviation layer 210 is positioned between the first passivation layer 220 and the flexible substrate 100. The alleviation layer 210 alleviates the stress caused due to the bending of the flexible substrate 100 and shifts the position of the neutral plane (NP) formed in the display device 1000. The alleviation layer 210 has a smaller Young's modulus than the flexible substrate 100 and stronger brittleness (e.g., less brittle) than the flexible substrate 100. That is, the alleviation layer 210 is more brittle than the flexible substrate 100, and as a result, a part of the alleviation layer 210 corresponding to the bending area BA of the flexible substrate 100 includes one or more cracks 211. The cracks 211 of the alleviation layer 210 may occur due to the bending of the flexible substrate 100 and may be the atypical cracks. Contrary to this, the other part of the alleviation layer 210 corresponding to the non-bending area NBA of the flexible substrate 100 is uncracked.

The alleviation layer 210 includes a plurality of openings 212. Each of the plurality of openings 212 exposes the flexible substrate 100, and as a result, the alleviation layer 210 may have an island shape by each of the plurality of openings 212.

The alleviation layer 210 contacts each of the first passivation layer 220 and the flexible substrate 100, and the first passivation layer 220 and the flexible substrate 100 may prevent or reduce instances of fragments of the alleviation layer 210 in which the cracks 211 occur from unintentionally moving toward the driving unit 300.

The alleviation layer 210 includes brittle metal or metal oxide. As one example, the alleviation layer 210 may include brittle metal or metal oxide such as MoOx, Mo, Ti, and the like. The alleviation layer 210 may have a smaller Young's modulus and stronger brittleness (e.g., less brittle) than each of the first passivation layer 220 and the flexible substrate 100 and the first passivation layer 220 and the flexible substrate 100 may have larger Young's modulus than the alleviation layer 210. As a result, a part of the alleviation layer 210 corresponding to the bending area BA of the flexible substrate 100 may include one or more cracks 211 and even though the cracks 211 occur at a part of the alleviation layer 210, no crack occurs in each of the first passivation layer 220 and the flexible substrate 100. The alleviation layer 210 may have a smaller thickness than each of the first passivation layer 220 and the flexible substrate 100.

The passivation layer 220 is positioned between the alleviation layer 210 between the alleviation layer 210 and the display unit 400, and the driving unit 300. The first passivation layer 220 is positioned in each of the plurality of openings 212 formed in the alleviation layer 210, and as a result, the alleviation layer 210 having the island shape is surrounded by the first passivation layer 220 and the flexible substrate 100. As one example, the alleviation layer 210 in which the cracks 211 occur to correspond to the bending area BA may be encapsulated by the first passivation layer 220 and the flexible substrate 100, and the alleviation layer 210 in which the cracks 211 occur is encapsulated by the first passivation layer 220 and the flexible substrate 100 to prevent or reduce instances of the fragments of the alleviation layer 210 from moving to the driving unit 300 or to the outside.

The first passivation layer 220 and the flexible substrate 100 are separated from each other with the alleviation layer 210 interposed therebetween and contact the alleviation layer 210. The first passivation layer 220 may have larger Young's modulus than the alleviation layer 210. The first passivation layer 220 may include a high elastic polymer material such as PSA and PDMS or a high flexible metallic material such as Al and Au, but is not limited thereto and may include various polymer materials or various metallic materials. The first passivation layer 220 prevents the fragments of the alleviation layer 210 by the cracks 211 in the alleviation layer 210 from moving to the driving unit 300.

The compressive stress by the compensation layer 200 is applied to the active layer 311 corresponding to the bending area BA of the flexible substrate 100 in the active layer 311 of the thin film transistor 310 of the driving unit 300. For example, in the display device 1000, the neutral plane NP is formed between the compensation layer 200 and the flexible substrate 100 which is a center portion of a total thickness to correspond to the total thickness formed by each of the flexible substrate 100, the compensation layer 200, the driving unit 300, the display unit 400, and the encapsulation part 500, but the neutral plane NP is formed between the driving unit 300 and the display unit 400 by the compensation layer 200 at a part of the display device 1000 corresponding to the bending area BA of the flexible substrate 100, and as a result, the alleviated compressive stress is applied to the active layer 311.

As one example, when a bending moment occurs at a part of the display device 1000 corresponding to the bending area BA of the flexible substrate 100, the alleviation layer 210 of the compensation layer 200 corresponding to the bending area BA is transformed due to the cracks 211 according to the stress applied to the display device 1000, and as a result, the stress applied to a part of the display device 1000 corresponding to the bending area BA of the flexible substrate 100 is alleviated and the neutral plane NP moves between the driving unit 300 and the display unit 400 to correspond to a thickness formed by the driving unit 300 and the display unit 400. Therefore, the alleviated compressive stress is applied to the active layer 311.

That is, when the bending moment occurs at a part of the display device 1000 corresponding to the bending area BA of the flexible substrate 100, the cracks 211 occur in the compensation layer 200 which has a smaller Young's modulus and stronger brittleness (e.g., less brittle), which corresponds to the bending area BA of the flexible substrate 100 due to the stress, and as a result, the stress applied to a part of the display device 1000 corresponding to the bending area BA is alleviated and the neutral plane NP moves between the driving unit 300 and the display unit 400 to correspond to the bending area BA with the transformation of the compensation layer 200. Therefore, not tensile stress but the alleviated compressive stress is applied to the active layer 311 to prevent the active layer 311 from being broken.

As described above, in another example embodiment of the present invention, when the bending moment occurs at a part of the display device 1000 corresponding to the bending area BA of the flexible substrate 100, the cracks 211 may occur in the compensation layer 200, which has a smaller Young's modulus and stronger brittleness (e.g., less brittle), which corresponds to the bending area BA of the flexible substrate 100 due to the stress, and as a result, the stress applied to a part of the display device 1000 corresponding to the bending area BA may be alleviated and the neutral plane NP may move between the driving unit 300 and the display unit 400 to correspond to the bending area BA with the transformation of the compensation layer 200. Therefore, not the tensile stress but the alleviated compressive stress is applied to the active layer 311 to prevent or reduce instances of the active layer 311 being broken.

That is, a display device 1000 is provided in which even though a part equal to or larger than a part of the flexible substrate 100 is bent, incidences of the thin film transistor 310 corresponding to the bent part being broken due to stress may be prevented or reduced.

Hereinafter, a display device according to another example embodiment of the present invention will be described with reference to FIG. 7. Hereinafter, different parts from the display device according to the example embodiment of the present invention described above will be described.

Figure 7:
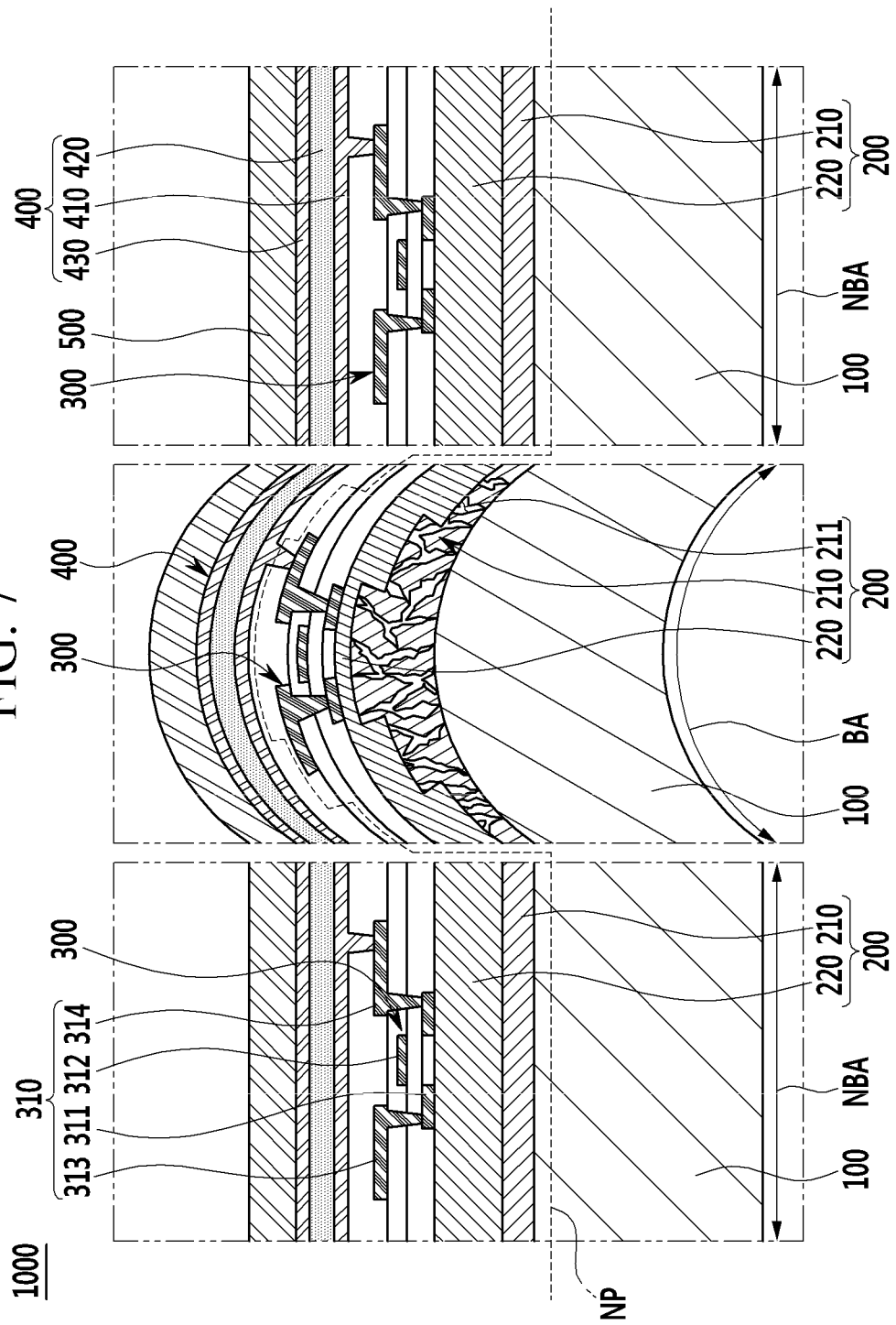
FIG. 7 is a cross-sectional view illustrating each of the bending area and the non-bending area of the display device according to example embodiments of the present invention.

FIG. 7 is a cross-sectional view illustrating each of the bending area and the non-bending area of the display device according to another example embodiment of the present invention.

As illustrated in FIG. 7, the compensation layer 200 of the display device 1000 according to another example embodiment of the present invention includes an alleviation layer 210 and the first passivation layer 220.

The alleviation layer 210 is positioned between the first passivation layer 220 and the flexible substrate 100. The alleviation layer 210 alleviates the stress caused due to the bending of the flexible substrate 100 and shifts the position of the neutral plane (NP) formed in the display device 1000. The alleviation layer 210 has a smaller Young's modulus than the flexible substrate 100 and stronger brittleness (e.g., less brittle) than the flexible substrate 100. That is, the alleviation layer 210 is more brittle than the flexible substrate 100, and as a result, a part of the alleviation layer 210 corresponding to the bending area BA of the flexible substrate 100 includes one or more cracks 211. The cracks 211 of the alleviation layer 210 may occur due to the bending of the flexible substrate 100 and may be atypical or irregularly shaped cracks. Additionally, the other part of the alleviation layer 210 corresponding to the non-bending area NBA of the flexible substrate 100 may be uncracked.

The alleviation layer 210 contacts each of the first passivation layer 220 and the flexible substrate 100, and the first passivation layer 220 and the flexible substrate 100 prevent or reduces incidences of fragments of the alleviation layer 210 in which the cracks 211 occur from unintentionally moving toward the driving unit 300.

A part of the alleviation layer 210 corresponding to the bending area BA of the flexible substrate 100 has a larger thickness than the other part of the alleviation layer 210 corresponding to the non-bending area NBA of the flexible substrate 100.

For example, the thickness of a part of the alleviation layer 210 corresponding to the bending area BA may be in proportion to the size of a curvature radius of a part of the flexible substrate 100 corresponding to the bending area BA. As one example, when the size of the curvature radius of a part of the flexible substrate 100 corresponding to the bending area BA is smaller, the thickness of a part of the alleviation layer 210 is larger and when the size of the curvature radius of a part of the flexible substrate 100 corresponding to the bending area BA is larger, the thickness of a part of the alleviation layer 210 may be smaller. That is, the thickness of the alleviation layer 210 may be formed stepwise to correspond to the size of the curvature radius of the bending area BA of the flexible substrate 100.

The alleviation layer 210 includes brittle metal or metal oxide. As one example, the alleviation layer 210 may include brittle metal or metal oxide such as MoOx, Mo, Ti, and the like. The alleviation layer 210 may have a smaller Young's modulus and stronger brittleness (e.g., less brittle) than each of the first passivation layer 220 and the flexible substrate 100 and the first passivation layer 220 and the flexible substrate 100 may have larger Young's modulus than the alleviation layer 210. As a result, a part of the alleviation layer 210 corresponding to the bending area BA of the flexible substrate 100 may include one or more cracks 211 and even though the cracks 211 occur at a part of the alleviation layer 210, no crack occurs in each of the first passivation layer 220 and the flexible substrate 100. The alleviation layer 210 may have a smaller thickness than each of the first passivation layer 220 and the flexible substrate 100.

The passivation layer 220 is positioned between the alleviation layer 210 between the alleviation layer 210 and the display unit 400, and the driving unit 300.

The first passivation layer 220 and the flexible substrate 100 are separated from each other with the alleviation layer 210 interposed therebetween and contact the alleviation layer 210. The first passivation layer 220 may have larger Young's modulus than the alleviation layer 210. The first passivation layer 220 may include a high elastic polymer material such as PSA and PDMS or a high flexible metallic material such as Al and Au, but is not limited thereto and may include various polymer materials or various metallic materials. The first passivation layer 220 prevents or reduces incidences of the fragments of the alleviation layer 210 by the cracks 211 in the alleviation layer 210 moving to the driving unit 300.

The compressive stress by the compensation layer 200 is applied to the active layer 311 corresponding to the bending area BA of the flexible substrate 100 in the active layer 311 of the thin film transistor 310 of the driving unit 300. In detail, in the display device 1000, the neutral plane NP is formed between the compensation layer 200 and the flexible substrate 100 which is a center portion of a total thickness to correspond to the total thickness formed by each of the flexible substrate 100, the compensation layer 200, the driving unit 300, the display unit 400, and the encapsulation part 500, but the neutral plane NP is formed stepwise between the driving unit 300 and the display unit 400 by the thickness of the compensation layer 200, which is in inverse proportion to the size of the curvature radius of the flexible substrate 100 at a part of the display device 1000 corresponding to the bending area BA of the flexible substrate 100, and as a result, the alleviated compressive stress is applied to the active layer 311.

As one example, when a bending moment occurs at a part of the display device 1000 corresponding to the bending area BA of the flexible substrate 100, the alleviation layer 210 of the compensation layer 200 corresponding to the bending area BA is transformed due to the cracks 211 according to the stress applied to the display device 1000, and as a result, the stress applied to a part of the display device 1000 corresponding to the bending area BA of the flexible substrate 100 is alleviated and the neutral plane NP moves between the driving unit 300 and the display unit 400 to correspond to a thickness formed by the driving unit 300 and the display unit 400. Therefore, the alleviated compressive stress is applied to the active layer 311.

That is, when the bending moment occurs at a part of the display device 1000 corresponding to the bending area BA of the flexible substrate 100, the cracks 211 occur in the compensation layer 200 which has a smaller Young's modulus and stronger brittleness (e.g., less brittle), which corresponds to the bending area BA of the flexible substrate 100 due to the stress, and as a result, the stress applied to a part of the display device 1000 corresponding to the bending area BA is alleviated and the neutral plane NP moves between the driving unit 300 and the display unit 400 to correspond to the bending area BA with the transformation of the compensation layer 200. Therefore, not tensile stress but the alleviated compressive stress is applied to the active layer 311 to prevent or reduce incidences of the active layer 311 being broken.

As described above, in another example embodiment of the present invention, when the bending moment occurs at a part of the display device 1000 corresponding to the bending area BA of the flexible substrate 100, the cracks 211 occur in the compensation layer 200 which has a smaller Young's modulus and stronger brittleness (e.g., less brittle), which corresponds to the bending area BA of the flexible substrate 100 due to the stress, and as a result, the stress applied to a part of the display device 1000 corresponding to the bending area BA is alleviated and the neutral plane NP moves between the driving unit 300 and the display unit 400 to correspond to the bending area BA with the transformation of the compensation layer 200. Therefore, not the tensile stress but the alleviated compressive stress is applied to the active layer 311 to prevent or reduce incidences of the active layer 311 being broken.

That is, a display device 1000 is provided in which even though a part equal to or larger than a part of the flexible substrate 100 is bent, the thin film transistor 310 corresponding to the bent part is prevented from being broken due to the stress.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims, and their equivalents.

What is claimed is:

1. A display device comprising:
a flexible substrate;
a display unit on the flexible substrate and configured to display an image; and
a compensation layer between the flexible substrate and the display unit, wherein the compensation layer is cracked, as a result of bending at a bending area, and the display unit is uncracked within the bending area.

2. The display device of claim 1, wherein:
the compensation layer comprises an alleviation layer having smaller Young's modulus than the flexible substrate.

3. The display device of claim 2, wherein:
a brittleness of the alleviation layer is stronger than a brittleness of the flexible substrate.

4. The display device of claim 2, wherein:
the alleviation layer comprises metal.

5. The display device of claim 2, wherein:
the alleviation layer comprises metal oxide.

6. The display device of claim 2, wherein:
the compensation layer further comprises a first passivation layer between the alleviation layer and the display unit.

7. The display device of claim 6, wherein:
a Young's modulus of the first passivation layer is larger than a Young's modulus of the alleviation layer.

8. The display device of claim 6, wherein:
the first passivation layer contacts the alleviation layer.

9. The display device of claim 8, wherein:
the alleviation layer contacts the flexible substrate.

10. The display device of claim 8, wherein:
the alleviation layer comprises a plurality of openings.

11. The display device of claim 10, wherein:
the first passivation layer is in each of the plurality of openings.

12. The display device of claim 6, wherein:
the compensation layer further comprises a second passivation layer between the alleviation layer and the flexible substrate.

13. The display device of claim 12, wherein:
a Young's modulus of the second passivation layer is larger than a Young's modulus of the alleviation layer.

14. The display device of claim 12, wherein:
the second passivation layer contacts the alleviation layer.

15. The display device of claim 2, wherein:
the flexible substrate comprises the bending area configured to be bent in a direction.

16. The display device of claim 15, wherein:
the flexible substrate comprises a non-bending area adjacent to the bending area.

17. The display device of claim 16, wherein:
a first part of the alleviation layer corresponding to the non-bending area is uncracked.

18. The display device of claim 15, wherein:
a second part of the alleviation layer corresponding to the bending area comprises one or more cracks.

19. The display device of claim 18, wherein:
the cracks are atypical cracks.

20. The display device of claim 15, wherein:
a part of the alleviation layer corresponding to the bending area is thicker than a part of the alleviation layer outside the bending area.

21. The display device of claim 15, wherein:
the flexible substrate corresponding to the bending area has a curvature radius, and
a thickness of the alleviation layer is inversely proportional to a size of the curvature radius.

22. The display device of claim 15, wherein the display unit comprises an organic light emitting diode on the flexible substrate, and
the display device comprises a driving unit between the compensation layer and the display unit and comprising a thin film transistor connected to the organic light emitting diode.

23. The display device of claim 22, wherein:
the thin film transistor comprises an active layer on the flexible substrate, and
compressive stress is applied to the active layer corresponding to the bending area.

24. A display device comprising:
a flexible substrate;
a display unit on the flexible substrate and configured to display an image; and
a compensation layer between the flexible substrate and the display unit and having smaller Young's modulus than the flexible substrate such that the display unit is configured to be uncracked within a bending area where the compensation layer is cracked as a result of bending at the bending area.

25. A display device comprising:
a flexible substrate;
a display unit on the flexible substrate and configured to display an image; and
a compensation layer between the flexible substrate and the display unit and having stronger brittleness than the flexible substrate such that the display unit is configured to be uncracked within a bending area where the compensation layer is cracked as a result of bending at the bending area.

26. A display device comprising:
a flexible substrate comprising a bending area configured to be bent in a direction;
a display unit on the flexible substrate and configured to display an image; and
a compensation layer between the flexible substrate and the display unit, wherein a first part of the compensation layer corresponding to the bending area comprises one or more cracks as a result of bending at the bending area and the display unit is uncracked within the bending area.

27. The display device of claim 26, wherein:
the flexible substrate further comprises a non-bending area contiguous with the bending area.

28. The display device of claim 27, wherein:
a second part of the compensation layer corresponding to the non-bending area is uncracked.

29. The display device of claim 26, wherein:
the cracks are atypical cracks.

30. The display device of claim 26, wherein:
a Young's modulus of the compensation layer is smaller than a Young's modulus of the flexible substrate.

* * * * *